United States Patent [19]

Lattin

[11] 3,911,466

[45] Oct. 7, 1975

[54] DIGITALLY CONTROLLABLE ENHANCED CAPACITOR

[75] Inventor: William W. Lattin, Phoenix, Ariz.

[73] Assignee: Motorola, Inc., Chicago, Ill.

[22] Filed: Oct. 29, 1973

[21] Appl. No.: 410,678

[52] U.S. Cl. .................... 357/23; 307/304; 357/14; 357/41

[51] Int. Cl.$^2$ ................ H01L 27/04; H01L 29/78; H01L 29/94

[58] Field of Search ........ 307/238, 304; 357/14, 23, 357/24, 41

[56] References Cited

UNITED STATES PATENTS

| | | | |
|---|---|---|---|
| 3,411,053 | 11/1968 | Wiesner | 317/234 UA |
| 3,612,964 | 10/1971 | Kawazu | 317/234 UA |
| 3,652,906 | 3/1972 | Christensen | 357/41 |
| 3,704,384 | 11/1972 | De Simone et al. | 317/234 UA |
| 3,810,125 | 5/1974 | Stein | 357/23 |
| 3,812,517 | 5/1974 | Sato et al. | 307/304 |

*Primary Examiner*—William D. Larkins
*Attorney, Agent, or Firm*—Vincent J. Rauner; Charles R. Hoffman

[57] ABSTRACT

A digitally controllable enhanced field effect capacitor is produced by providing a first source region of a first conductivity type contiguous with a main channel region in a body of semiconductor of a second conductivity type. The source region includes a plurality of source subregions.

A plurality of separate regions of the first conductivity type are provided in the body of semiconductor, each contiguous with the main channel region and a separate secondary channel region, each of the secondary channel regions being contiguous with one of the source subregions. A main gate conductor overlies the main channel region, and a plurality of secondary gate electrodes overlie, respectively, the secondary channel regions. The secondary gate electrodes may be controlled so as to sequentially couple each of the separate regions to the source region and hence to the main channel region, rapidly charging the adjacent portions of the main channel region and increasing the high frequency capacitance of the digitally controllable enhanced capacitor.

7 Claims, 5 Drawing Figures

DIGITALLY CONTROLLABLE ENHANCED CAPACITOR

BACKGROUND OF THE INVENTION

Enhanced capacitors have been utilized to provide feedback in MOS bootstrap circuits and to provide controlled coupling in certain MOS memory circuits and decoding circuits. Such enhanced capacitors have included a diffused source region and a gate conductor overlying the channel region. In such devices, a voltage of the proper polarity applied to the gate electrode results in formation of an inversion region in the channel region of the enhanced capacitor. The inversion region tends to act as an extension of the source region under the gate oxide, increasing the capacitive coupling between the gate electrode and the source. Normally, the source region is heavily doped, and therefore has very low resistance. However, the inversion region has a substantial sheet resistance associated therewith. The portions of the inversion region remote from and interior to the adjacent edge of the source region must be charged through this resistance. As a result, the high frequency capacitance of the enhanced capacitor (or, stated differently, the switching performance of the enhanced capacitor) is seriously degraded. In order to provide efficient enhanced capacitors in MOS integrated circuits, it is known to provide an extension of the source region which extends around and is contiguous with the periphery of the channel region or to provide an elongated channel region in contact with an elongated source region. However, such enhanced capacitors have a fixed value at a particular frequency once strong inversion is established in the channel region by application of a sufficiently large magnitude gate-source voltage. MOS varactor diodes having a single gate electrode and discontinuous gate dielectrics have been used to provide a device which has a "stepped" or digitalized change in output capacitance as a function of the applied gate-source voltage at a given frequency. However, no digital enhanced capacitor is known which is capable of accepting digital binary pattern of input voltages which controllably produce a digitalized gate-to-source capacitance characteristic. Such a digitally controlled capacitor would have numerous applications, such as in integrated circuit analog-to-digital and digital-to-analog converters or in digitally controlled frequency oscillators. A shortcoming of known enhanced capacitors in which the source region extends around the channel region of the capacitor is that the gate-to-source overlap capacitance tends to degrade circuit performance when the enhanced capacitor is supposed to be in the "off" condition.

SUMMARY OF THE INVENTION

It is an object of the invention to provide an improved enhanced field effect capacitor.

It is another object of the invention to provide an enhanced field effect capacitor having minimum overlap capacitance when the enhanced capacitor is in the "off" condition.

It is another object of the invention to provide an enhanced capacitor with a plurality of source regions which are digitally controllable coupled to a main channel region to increase the capacitance of the enhanced field effect capacitor by efficiently providing charge to the adjacent portion of the main channel region.

It is another object of the invention to provide a digitally controllable enhanced field effect capacitor including a plurality of source subregions and a plurality of gate electrodes capable of controllably coupling, respectively, each of the source subregions to a main channel region.

Briefly described, the invention is a digitally controllable enhanced field effect capacitor having a plurality of source electrodes. In one embodiment, an improved enhanced field effect capacitor is obtained by providing a first main source region in a body of semiconductor contiguous with a minor segment of the periphery of a main channel region, and a second source region in the body of semiconductor surrounding a major portion of the periphery of the main channel region.

The second source is electrically separated from the first source region, and is coupled thereto by a narrow portion of the main channel region when the enhanced capacitor is in the "on" condition. The second source region then provides charge to the adjacent portions of the main channel region, improving the frequency response of the enhanced field effect capacitor when it is in the "on" condition. However, the second source region is electrically floating when the enhanced capacitor is in the "off" condition, so that the physical overlap capacitance between the second source and the main gate electrode is decoupled from the first source region.

A second embodiment provides a digitally controllable enhanced field effect capacitor having a source region in a body of semiconductor and a gate conductor overlying the main channel region. The source region includes a plurality of source subregions, each contiguous with the main channel region. Adjacent to each of the secondary channel regions, respectively, is one of a plurality of drain regions in the body of semiconductor. Overlying each of the secondary channel regions is a secondary gate conductor. If a voltage applied between the main gate electrode and the main source electrode is of sufficient magnitude to cause strong inversion of the main channel region, the enhanced field effect capacitor is in the "on" condition. If voltages are applied to the secondary gate conductors, the source subregions are turned on around the periphery of the main channel region, and the respective source subregions are coupled through the adjacent secondary channel regions and drain regions to the main channel region. The capacitance between the main gate electrode and the main source electrode increases rather proportionately to the number of secondary source regions switched into contact with the main channel region. The capacitance characteristic of the digitally controllable enhanced capacitor is thus a function of the binary digital number represented by the voltage pattern applied to the secondary gate electrodes. The capacitance characteristic is also controlled by the shape of the main channel region.

DESCRIPTION OF THE INVENTION

Figure 1:
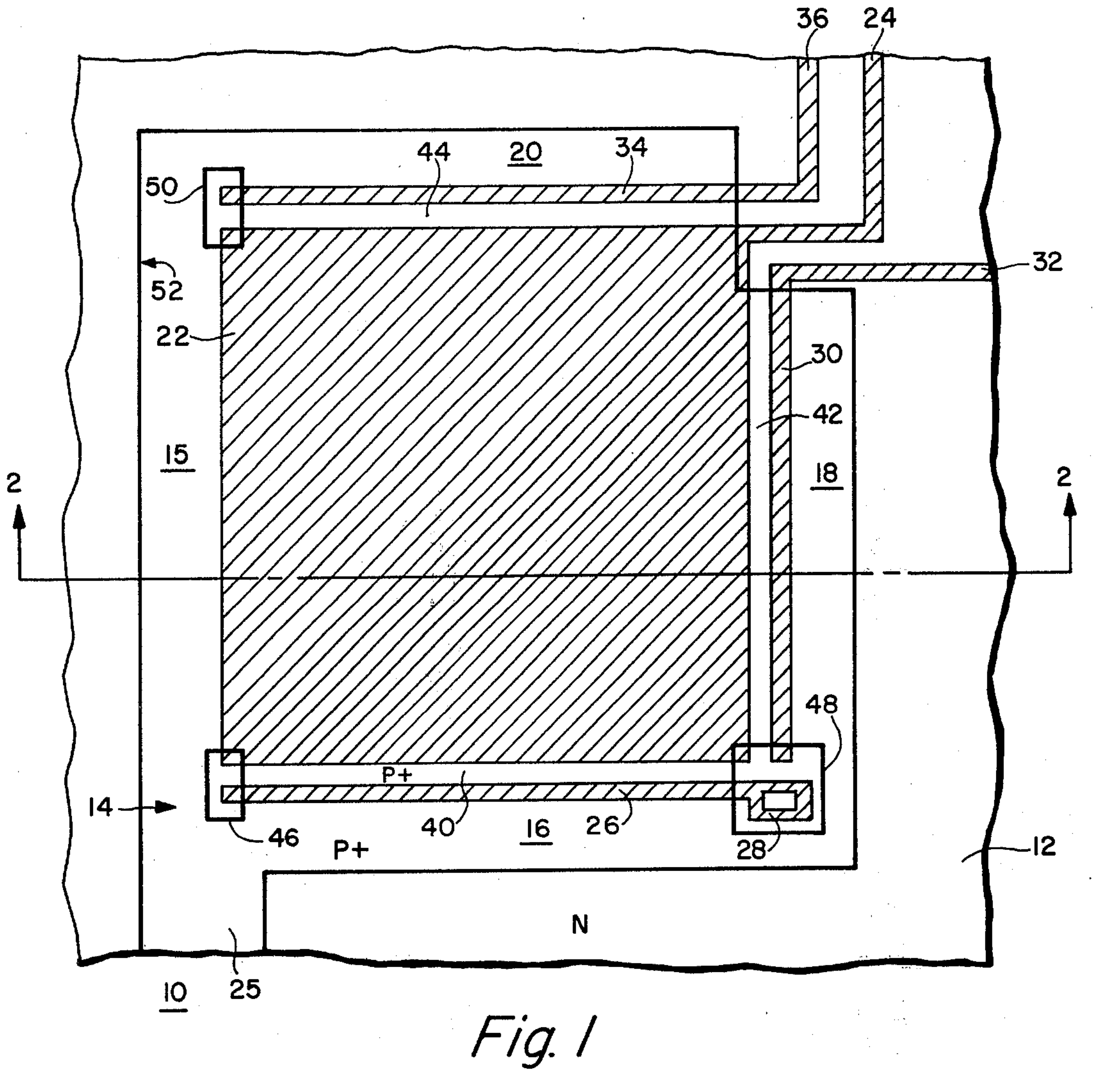
FIG. 1 is a plan view of a digitally controllable enhanced field effect capacitor.
Figure 2:
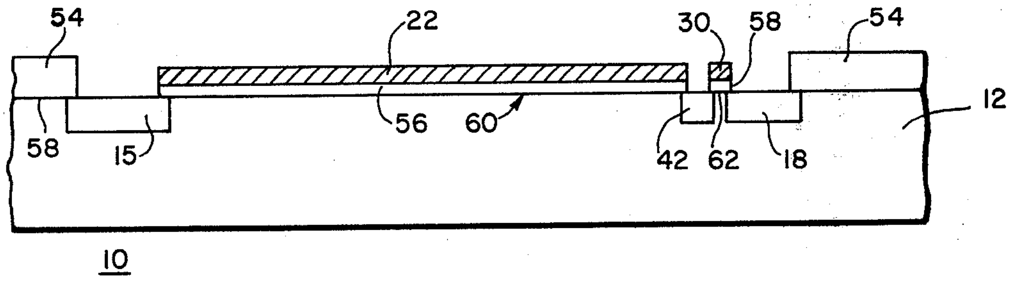
FIG. 2 is a cross-sectional view of the embodiment of FIG. 1 taken along the lines 2—2.

An embodiment of the invention is shown in FIG. 1, which is a plan view of digitally controllable enhanced field effect capacitor 10. Capacitor 10 is fabricated within a relatively lightly doped N-type region 12, which may have resistivity in the range from approximately 2 – 10 ohm-centimeters. Referring to both FIG. 1 and FIG. 2, capacitor 10 includes a relatively low resistivity (10 – 100 ohms per square) P-type region 14 formed within the N-type region 12 at upper surface 58 thereof. P-type region 14 forms the source region for enhanced capacitor 10, and includes main subregion 15 and secondary subregions 16, 18 and 20. It should be observed that the embodiment shown in FIG. 1 is a self-aligned implementation of the invention which advantageously utilizes silicon gate fabrication methods. The device in FIGS. 1 and 2 is a P-channel device. However, it should be noted that it is entirely feasible to reverse the conductivity types of regions 12 and 14 for some applications, in which case the enhanced capacitor would be an N-channel device.

Main gate conductor 22 overlies gate insulator 56, which may be silicon dioxide, which in turn lies on main channel region 60 in the portion of N-type body of semiconductor 12 at surface 58 underlying and coextensive with gate insulator 56. Gate insulator 56 may be approximately 1000 angstrom units in thickness. Gate conductor 22 is advantageously doped polycrystalline silicon having resistivity in the range from 25 to 300 ohms per square, and includes a polycrystalline silicon extension over thick field insulator 54 (which may be silicon dioxide 4,000 – 10,000 or more angstrom units thick) forming main gate electrode 24. Polycrystalline silicon region 30 lies on secondary gate oxide layer 58, forming a secondary channel region 62 which extends between source subregion 18 and drain region 42. Polycrystalline region 30 extends over thick oxide 54 to form secondary gate electrode 32. Similarly, polycrystalline region 26 overlies another secondary channel region thereunder which couples source subregion 16 to drain subregion 40, and polycrystalline region 34 overlies another channel subregion self-aligned therewith coupling source subregion 20 to drain subregion 44. Polycrystalline silicon gate conductors 26 and 34 extend, respectively, over field oxide 54 forming secondary gate electrodes 28 and 36.

Thick oxide regions 46, 48 and 50 prevent parasitic channeling around, and also define, the end points of drain subregions 40, 42 and 44. The boundary 52 defines the edge of thick oxide region 54 which bounds P-type region 14.

As is well-known, the main channel region 60 and the aforementioned secondary channel regions are self-aligned to the adjacent P-type regions because they are formed during the same processing step at which the polycrystalline silicon gate conductors are doped. The polycrystalline silicon gate conductors and also the thick oxide 54 serve as diffusion masks, thereby providing a self-aligned structure.

The structure indicated in FIGS. 1 and 2 is not limited to structures provided using the conventional silicon gate process. Main gate electrode 22 and secondary gate electrodes 26, 30 and 34, may, for example, be molybdenum. In fact, there is no requirement at all that a self-aligned MOS structure be utilized. Gate electrodes 22, 26, 30 and 34 may, for example, be aluminum, as is used in conventional metal gate processing, wherein the P-type regions are initially formed and the gate openings are separately made and aligned to the P-type regions, after which the gate oxide is grown and metal deposited thereon and patterned. Further, complementary MOS integrated circuits may include both P-channel and N-channel digitally controllable enhanced capacitors of the type described herein.

Figure 3:
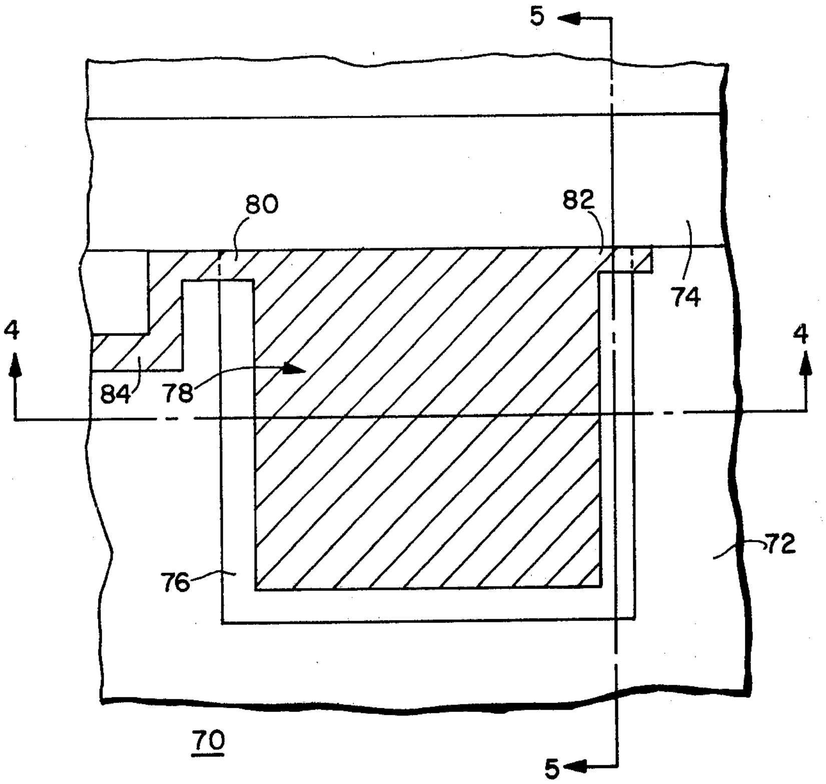
FIG. 3 is a plan view of an efficient enhanced capacitor in accordance with the invention.
Figure 4:
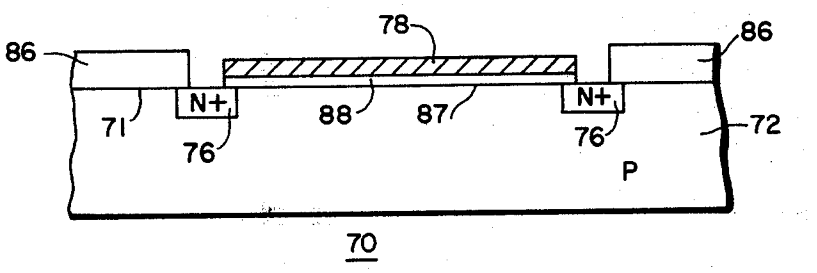
FIG. 4 is a cross-sectional view of the embodiment of FIG. 3 taken along the section lines 4—4.
Figure 5:
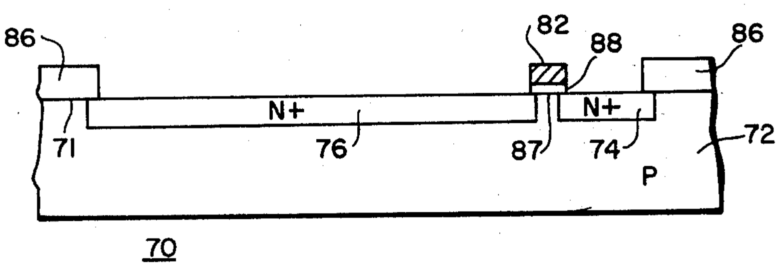
FIG. 5 is a cross-sectional view of the embodiment of FIG. 3 taken along the section lines 5—5.

FIG. 3 is a plan view of an improved enhanced capacitor useful in MOS circuits such as bootstrapped inverter or decoding circuits. Referring to FIGS. 3 – 5, enhanced capacitor 70 is fabricated at the upper surface 71 of P-type semiconductor body 72 and includes first N-type source region 74 and second N-type source subregion 76 formed within semiconductor body 72 at surface 71. Second source subregion 76 is electrically isolated from first source region 74 when enhanced capacitor 70 is in the "off" condition. (Although a P-channel enhanced capacitor is described, similar N-channel enhanced capacitors are within the scope of the invention).

Enhanced capacitor 70 further includes channel region 88 at surface 71, which is contiguous with first source region 74 and second source subregion 76. Gate insulator 88, which may be silicon dioxide, is formed on surface 71 and is essentially coextensive with channel region 87. Gate conductor 78, which may be polycrystalline silicon, is provided on gate insulator 88. Gate conductor 78 includes two narrow extensions 80 and 82, respectively, extending outwardly and adjacent to first source region 74. Gate conductor extension 80 extends outwardly over thick insulator 86 to form gate electrode 84. Extension 82 extends outwardly past the edge of second source subregion 76 and extends a short distance over thick oxide 86. The dotted lines indicate a boundary of the thick oxide region 86 in FIG. 3.

The operation of digitally controllable enhanced field effect capacitor 10 as shown in FIGS. 1 and 2 may be conveniently described, assuming that source region 14, is relatively heavily doped P-type material.

If a voltage is applied to main gate electrode 24 which is more negative than the voltage of main source region 25 by an amount equal to or greater than the MOS threshold voltage, an inversion region is formed in main channel region 60. (The inversion region consists of a very thin region of P-type majority carriers, i.e., holes, in the main channel region). Assuming that secondary gate electrodes 28, 32 and 36 are at substantially the same potential as first source region 25, the low frequency capacitance between main gate electrode 24 and source electrode 25 is determined essentially by the area of gate conductor 22, and is given by the equation $C_O = (AK_o\Sigma_o)/t_{ox}$, where A is the area of the main gate insulator, $K_o$ is the dielectric constant of the gate insulator, and $t_{ox}$ is the thickness of the gate insulator, and $\Sigma_o$ is the permittivity of freespace.

$C_O$ is referred to herein as the thin oxide capacitance. As the frequency is increased, the value of capacitance measured between electrodes 24 and 25 decreases. This is caused by the transit time required for the charge carriers to travel from the P-type region 15 to the most distant points therefrom of channel region 60. For example, at 10 KHz the value of capacitance measured between terminals 24 and 25 might be approximately 0.9 $C_0$, while at 1 MHz the measured capacitance might only be approximately 0.1 $C_0$. If a voltage sufficiently negative with respect to that of source electrode 25 is applied to secondary gate electrode 28, the secondary channel region beneath gate conductor 26 is inverted, coupling source subregion 16 to drain region 40, so that P-type majority carriers may be supplied from source subregion 16 to the adjacent portions of main channel region 60. This results in an increase in the capacitance measured between terminals 25 and 24. Similarly, applying a sufficiently negative voltage to secondary gate electrode 32 allows source subregion 18 to supply holes to the adjacent portion of main channel region 60, further increasing the high frequency capacitance measured between electrodes 24 and 25.

Thus, it is seen that although the very low frequency response of enhanced capacitor 10 is relatively unaffected by digitally switching in additional source subregions, the high frequency capacitance is drastically increased, since the switching in of additional source subregions reduces the distance which holes must travel in order to charge up the entire main channel region in response to voltage changes between terminals 24 and 25.

For an N-channel enhanced capacitor, the capacitance would be somewhat higher, since the capacitance of an enhanced capacitor is proportional to the surface mobility of the semiconductor at a particular frequency, and the surface mobility for electrons (N-type carriers) is greater than for holes (P-type carriers).

The operation of the enhanced capacitor 70 of FIG. 3 differs from that of the digitally controllable enhanced capacitor of FIG. 1 in that there are no secondary gate electrodes, and in that enhanced capacitor 70 includes a second source region 76 which is physically spaced from first source region 74. If enhanced capacitor 70 is in the "off" condition, such that strong inversion has not been established in channel region 87, then the capacitance between gate electrode 84 and source region 74 is very small in value, being determined by the physical overlap between source region 74 and gate conductor 78. The capacitance component of the physical overlap between second source region 76 and gate conductor 78 is substantially reduced, since second source subregion 76 is electrically floating. Thus, when the enhanced capacitor 70 is in the "off" condition, the stray capacitance associated with source region 74 is minimized. However, if enhanced capacitor 70 is in the "on" condition, the channel region 87 is inverted and acts as an extension of source region 74 which couples second source region 76 to source region 74 through the relatively narrow portions of the channel region beneath extensions 80 and 82 of gate conductor 78. Thus, it is seen that there exists a relatively low resistance portion of the channel region coupling second source subregion 76 to first source 74. Then, both first source region 74 and second source subregion 76 act to supply charge to the main portion of a channel region, reducing the transit time required to charge up the innermost portions of the channel region during switching operation or AC operation.

While the invention has been described in relation to several preferred embodiments thereof, variations in placement and arrangement of parts may be made within the scope of the invention to suit varying requirements.

What is claimed is:

1. An insulated gate field-effect enhanced capacitor comprising:

- a region of semiconductor material of a first conductivity type having a surface;
- a first source region of opposite conductivity type in said region of said first conductivity type and extending to said surface;
- second source region means of opposite conductivity type in said region of said first conductivity type and extending to said surface for supplying charge to a channel portion of said region of said first conductivity type;
- said first source region and said second source region means being spaced from each other by narrow portions of said region of said first conductivity type, said narrow portions being of first conductivity type, said first source region and said second source region means together substantially surrounding a channel portion of said region of said first conductivity type, said channel portion being much wider, measured between said first source region and said second source region means, than the width of said narrow portions;
- a gate insulator overlying said channel portion of said region of said first conductivity type, said narrow portions of said region of said first conductivity type and the edges of said first source region and second source region means which define said narrow portions of said region of said first conductivity type and said channel portion of said region of said first conductivity type; and
- a gate electrode overlying said gate insulator, and being directly above said narrow portions of said region of said first conductivity type and said channel portion of said region of said first conductivity type and extending at least to positions overlying portions of the edges of said first source region and said second source region means which define said narrow portions of said region of said first conductivity type and said channel portion of said region of said first conductivity type;
- said second source region means being connected to said first source region only upon application of a voltage to said gate electrode sufficient to produce inversion regions bridging said narrow portions of said region of said first conductivity type, so that the capacitance between said second source region and said gate electrode is effectively in parallel with the capacitance between said first source region and said gate electrode only upon application of said voltage to said gate electrode.

2. An insulated gate field-effect enhanced capacitor as recited in claim 1 wherein said second source region means extends along a substantial portion of the periphery of said channel portion.

3. An insulated gate field-effect enhanced capacitor as recited in claim 1 wherein said channel portion is substantially square.

4. An insulated gate field-effect enhanced capacitor including a region of semiconductor material of a first conductivity type having a surface,

- a first source region of opposite conductivity type located in said region of said first conductivity type and extending to said surface;

a gate insulator on said surface overlying a portion of said region of said first conductivity type, said portion of said region of said first conductivity type extending to said surface;

at least second and third source regions of said opposite conductivity type in said region of said first conductivity type and extending to said surface, said first, second and third source regions being spaced from each other, said first, second and third source region each contacting said portion of said region of said first conductivity type and being contiguous with said gate insulator;

a first gate electrode overlying said gate insulator and being directly above said portion of said region of said first conductivity type and extending at least to positions overlying portions of the junctions between said portion of said region of said first conductivity type and said first, second and third source regions;

at least second and third gate electrodes overlying said region of said first conductivity type and being separated therefrom by insulator material, said second gate electrode overlying a second portion of said region of said first conductivity type separating said first and second source regions, said third gate electrode overlying a third portion of said region of said first conductivity type separating said first and third source regions, said first and second source regions and said second gate electrode on said insulator material providing a first insulated gate field-effect transistor for coupling said second source region to said first source region, said first and third source regions and said third gate electrode providing a second insulated gate field-effect transistor for coupling said third source region to said first source region;

said first and second insulated gate field-effect transistors providing means for increasing capacitance between said first gate electrode and said first source region by coupling selected ones of said second and third source regions to said first source region by control signals applied to said second and third gate electrodes.

5. The insulated gate field-effect enhanced capacitor as recited in claim 4 wherein said first conductivity type is N type and said opposite conductivity type is P type.

6. The insulated gate field-effect enhanced capacitor as recited in claim 4 further including at least one additional source region contacting said portion of said region of said first conductivity type and coupled respectively, to said first source region by at least one corresponding field-effect transistor.

7. The insulated gate field-effect enhanced capacitor as recited in claim 6 wherein said first source region substantially surrounds said portion of said region of said first conductivity type.

* * * * *